United States Patent [19]

Tobin

[11] Patent Number: 5,672,436

[45] Date of Patent: Sep. 30, 1997

[54] OXIDATION PROTECTION METHOD FOR TITANIUM

[75] Inventor: Albert G. Tobin, Smithtown, N.Y.

[73] Assignee: Grumman Aerospace Corporation, Los Angeles, Calif.

[21] Appl. No.: 531,036

[22] Filed: May 31, 1990

[51] Int. Cl.$^6$ .................................................. B32B 5/06
[52] U.S. Cl. .................... 428/629; 428/660; 416/241 R; 416/241 B
[58] Field of Search ............................ 428/650, 651, 428/629, 660; 148/277, 285, 421; 416/241 R, 241 B

[56]  References Cited

U.S. PATENT DOCUMENTS

| | | | |
|---|---|---|---|
| 1,335,024 | 3/1920 | Peschko | 148/277 |
| 2,785,451 | 3/1957 | Hanink | 428/651 |
| 2,903,785 | 9/1959 | Hanink et al. | 428/651 |
| 2,992,135 | 7/1961 | Finlay | 428/651 |
| 3,037,880 | 5/1962 | Hanink | 428/651 |
| 3,359,142 | 12/1967 | Ward, Jr. | 428/651 |
| 3,615,279 | 10/1971 | Ward, Jr. | 428/651 |
| 3,730,783 | 5/1973 | Streel | 148/285 |
| 4,936,927 | 6/1990 | Grunke et al. | 148/13.1 |

FOREIGN PATENT DOCUMENTS

| | | | |
|---|---|---|---|
| 61-87893 | 5/1986 | Japan | 428/650 |
| 2-60738 | 3/1990 | Japan | 428/651 |

OTHER PUBLICATIONS

Subrabmanyam, "High Temperature Cyclic Oxidation of Aluminide Layers on Titanium", Oxidation of Metals, vol. 26, Nos. 3/4, 1986 pp. 275–285.

Kirk–Othmer Encyclopedia of Chemical Technology, 3rd Edition, Vol. 2; p. 181. John Wiley & Sons, New York: 1978.

Primary Examiner—Charles T. Jordan
Assistant Examiner—Anthony R. Chi
Attorney, Agent, or Firm—Terry J. Anderson; Karl J. Hoch, Jr.

[57]  ABSTRACT

The invention relates to a titanium article of manufacture having an oxidation resistant surface and a process for producing such article wherein said titanium has an aluminized surface layer formed on it by the vapor deposition of aluminum on the titanium followed by oxidizing the surface layer.

16 Claims, 12 Drawing Sheets

Effect of Aluminization on Oxidation of CP Titanium at 650°C

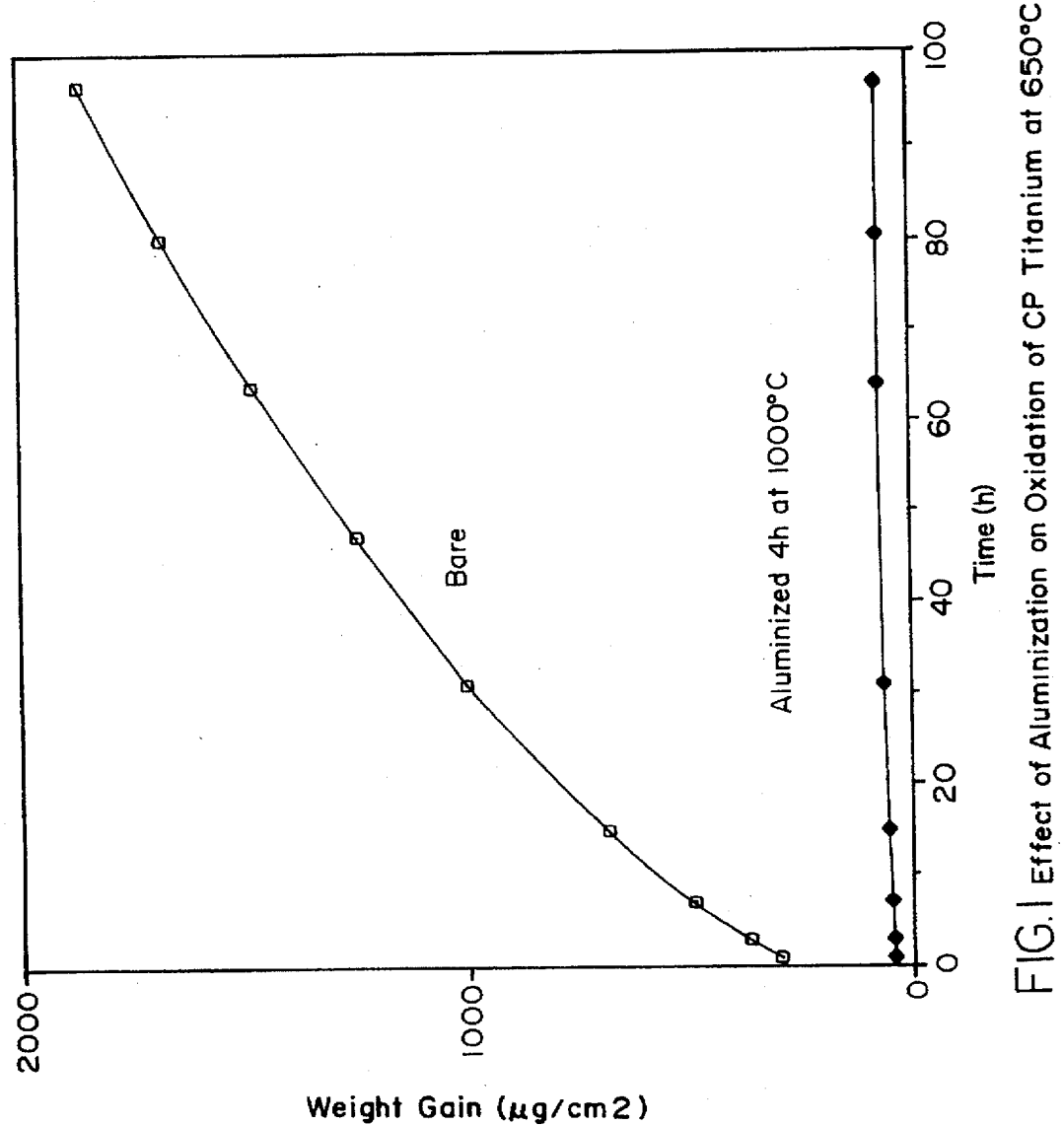
FIG.1 Effect of Aluminization on Oxidation of CP Titanium at 650°C

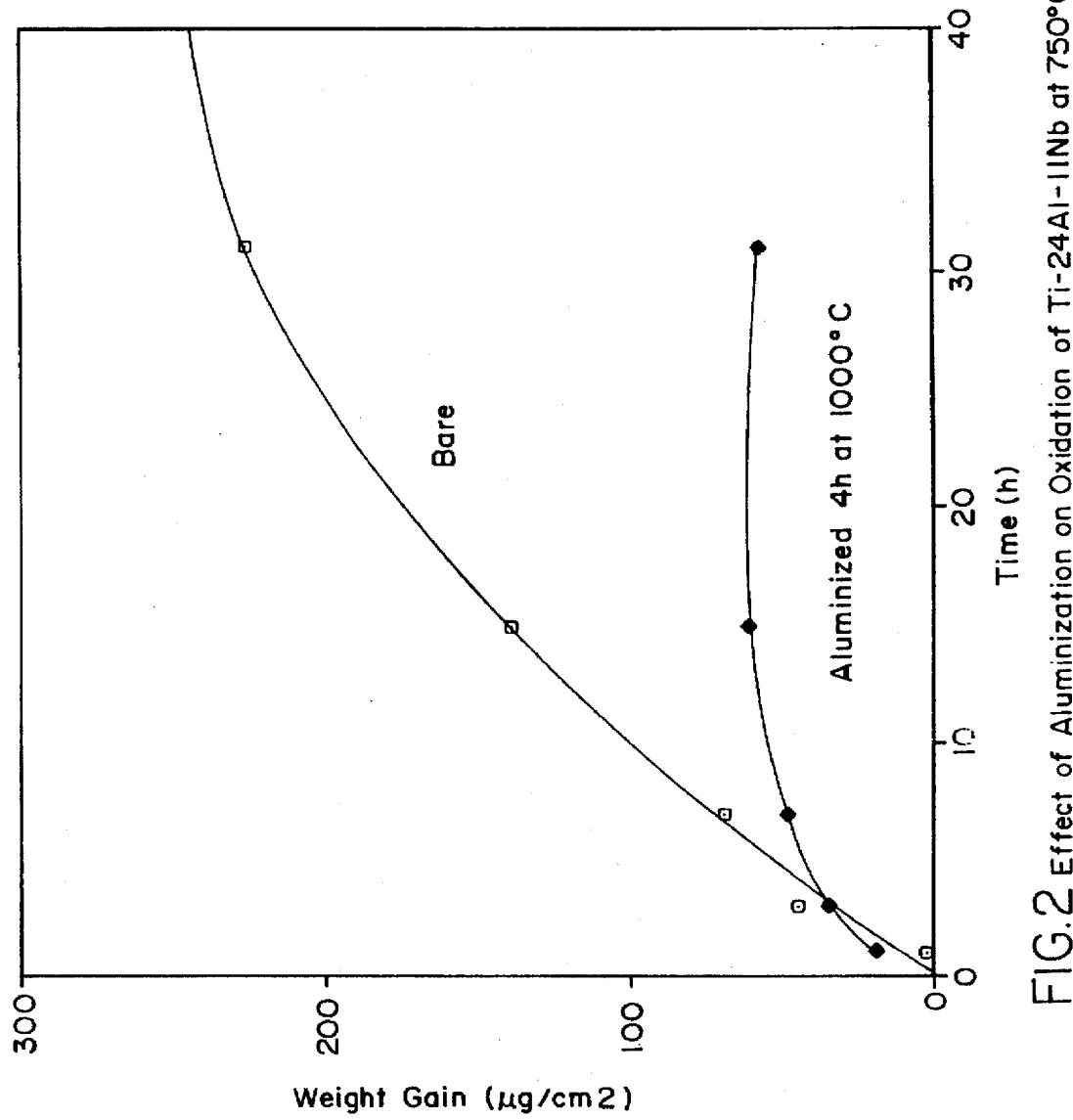
FIG. 2 Effect of Aluminization on Oxidation of Ti-24Al-11Nb at 750°C

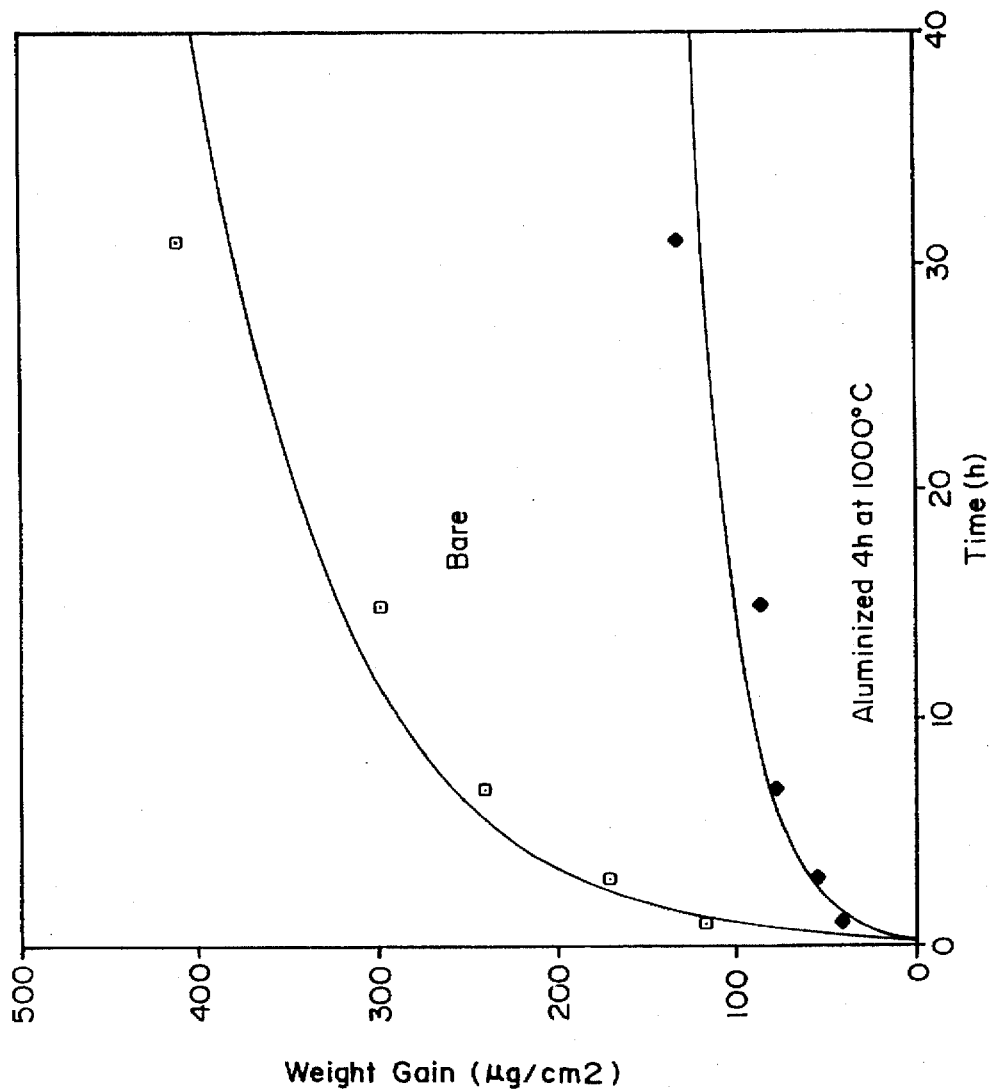
FIG. 3 Effect of Aluminization on Oxidation of Ti-24Al-11Nb at 815°C

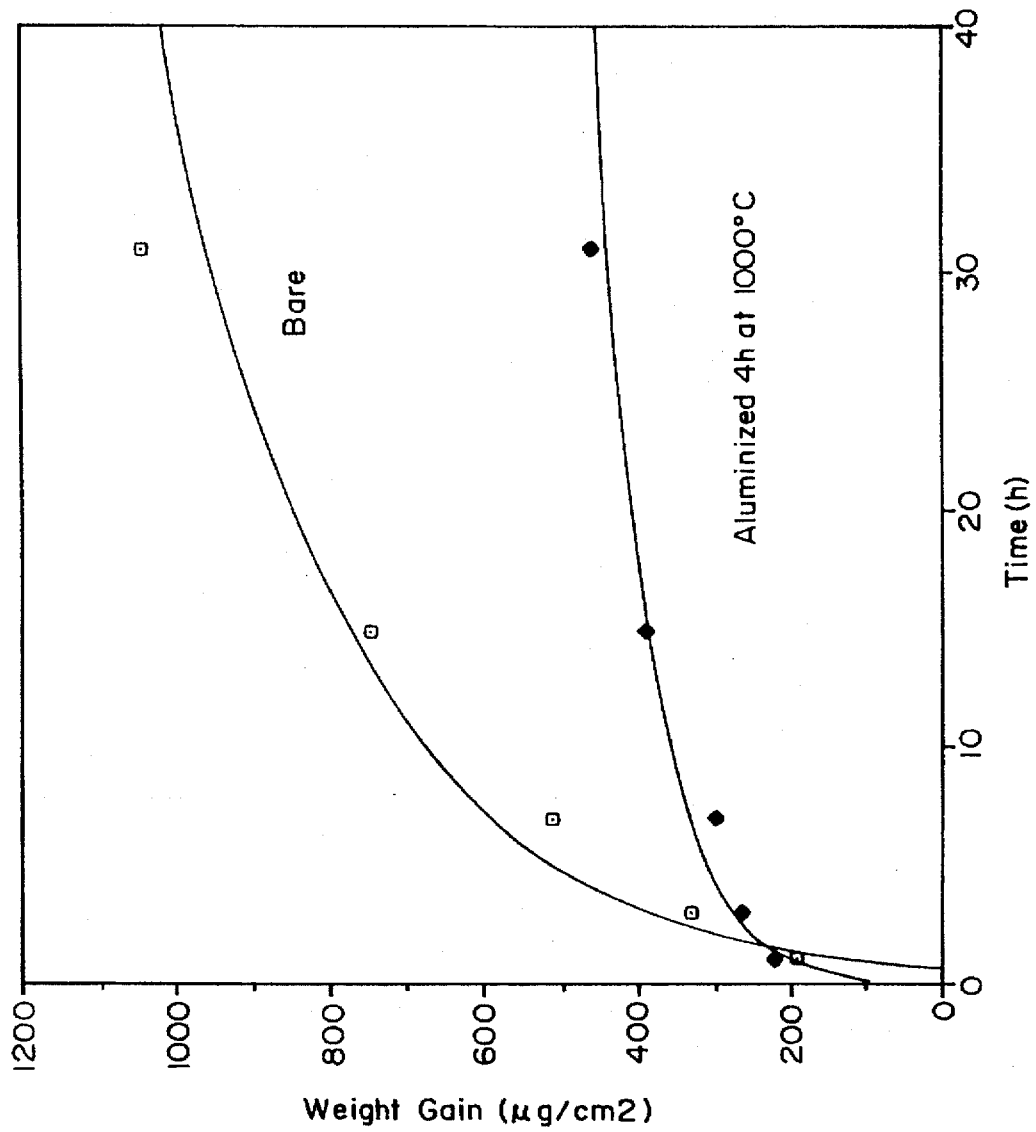
FIG. 4 Effect of Aluminization on Oxidation of Ti-24Al-11Nb at 900°C

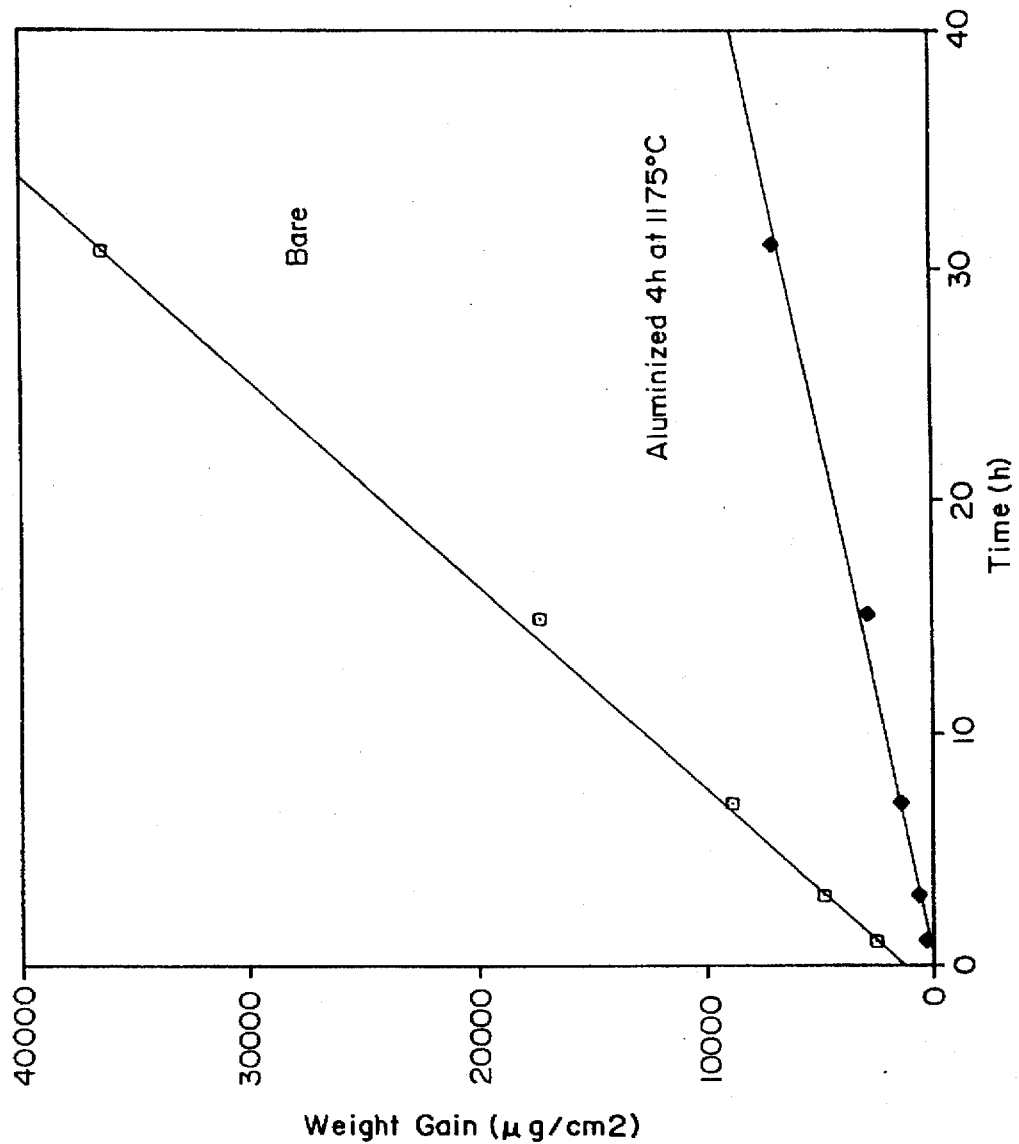
FIG. 5 Effect of Aluminization on Oxidation of Ti-15V-3Al at 750°C

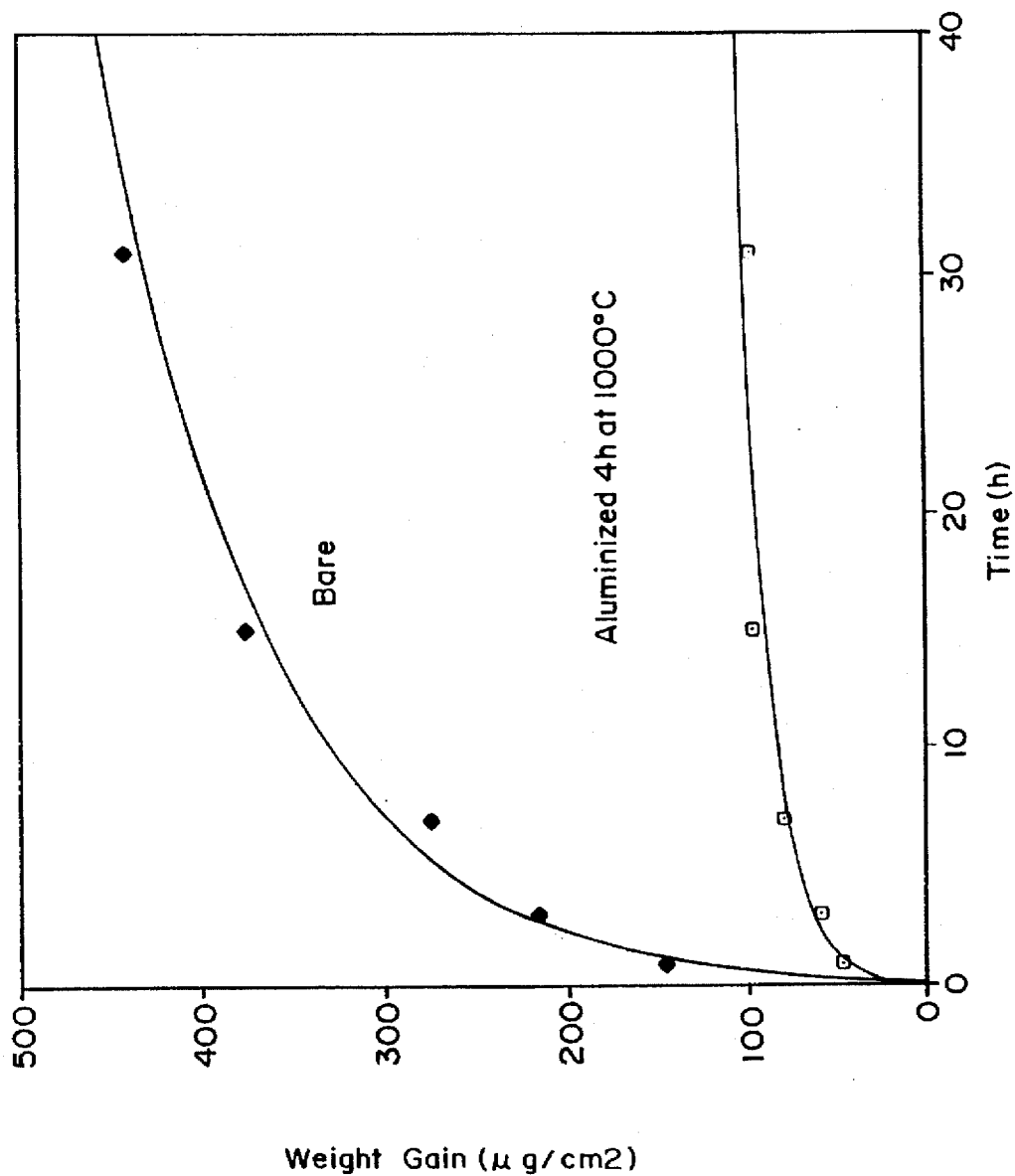
FIG. 6 Effect of Aluminization on Oxidation of Ti-25Al-10Nb-3V-1Mo at 750°C

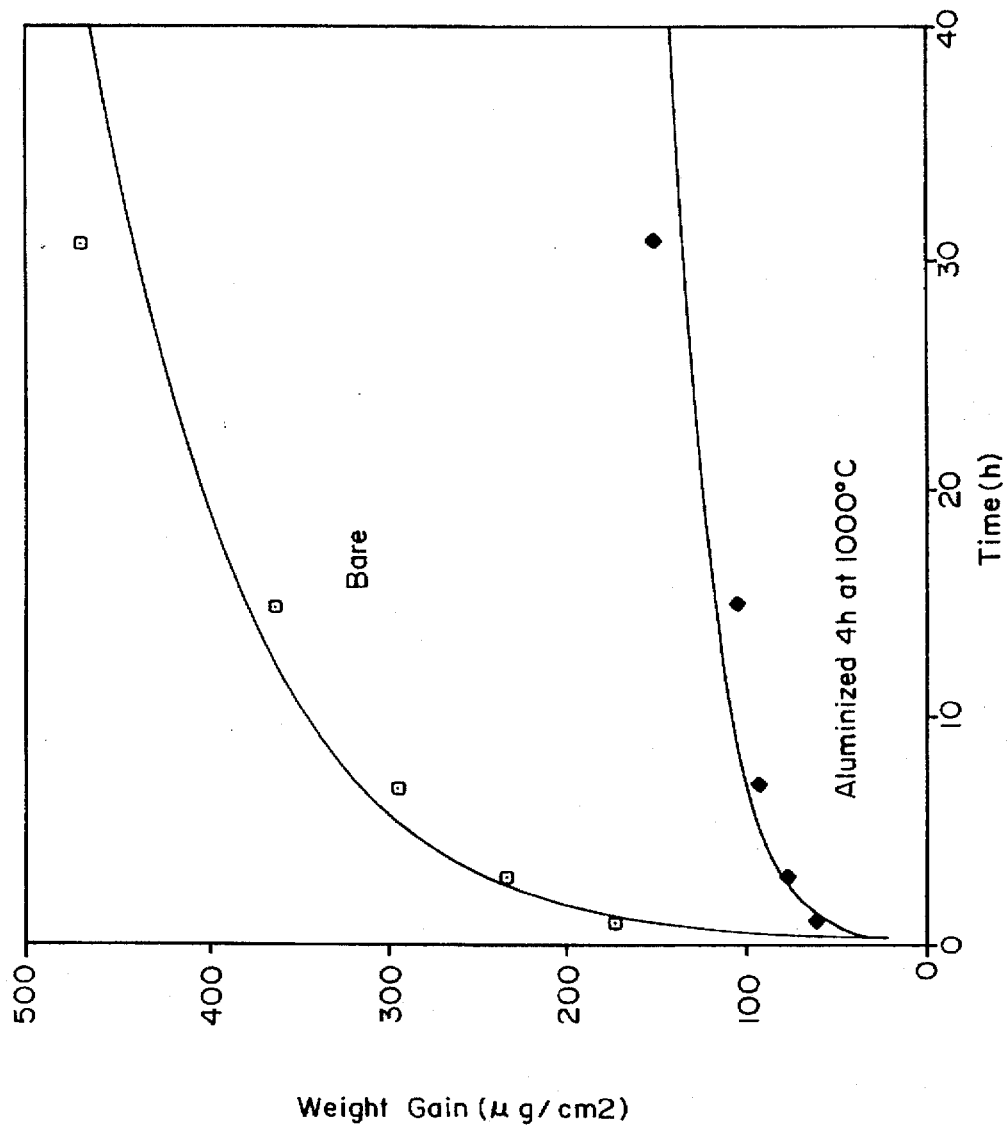
FIG. 7 Effect of Aluminization on Oxidation of Ti-25Al-10Nb-3V-1Mo at 815°C

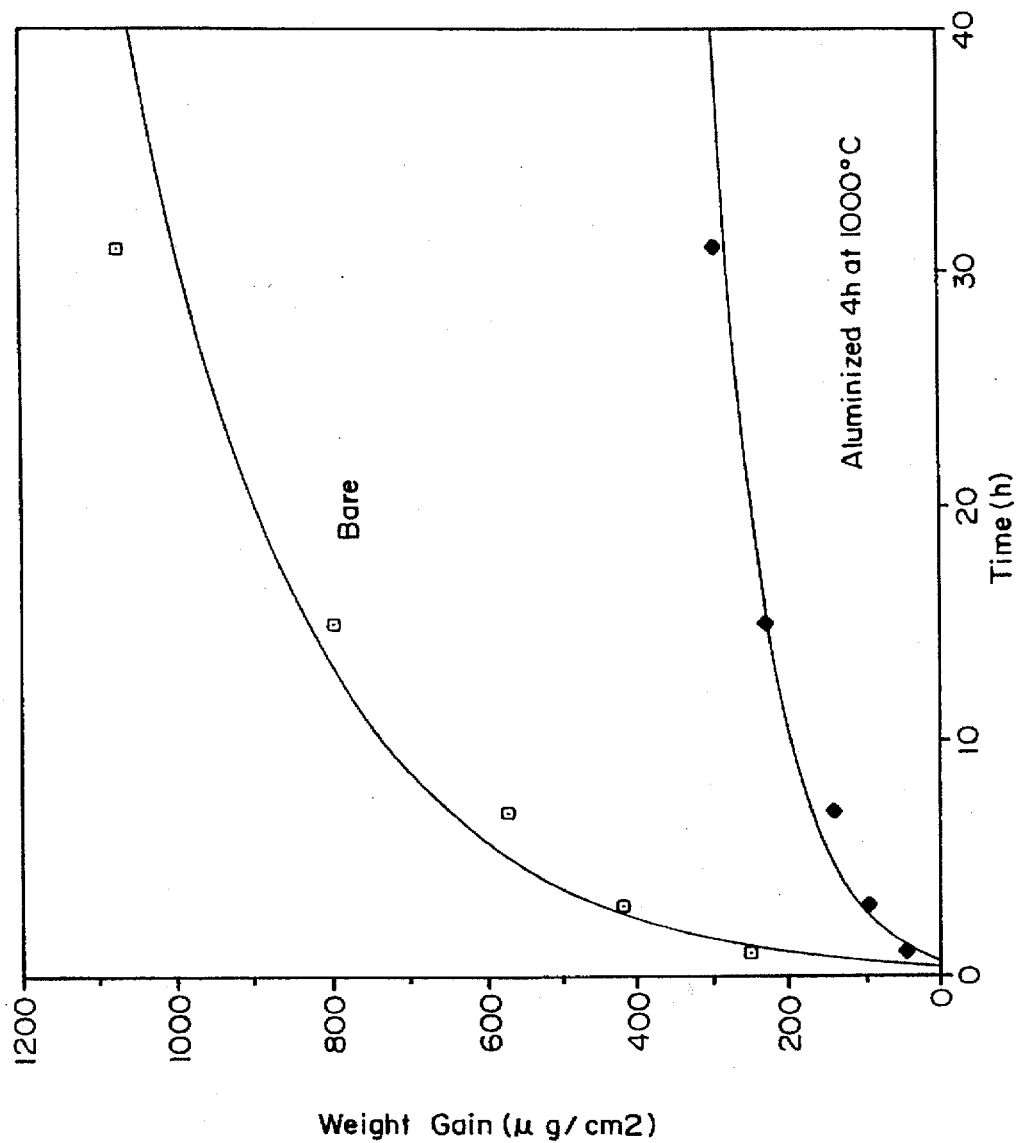
FIG. 8 Effect of Aluminization on Oxidation of Ti-25Al-10Nb-3V-1Mo at 900°C

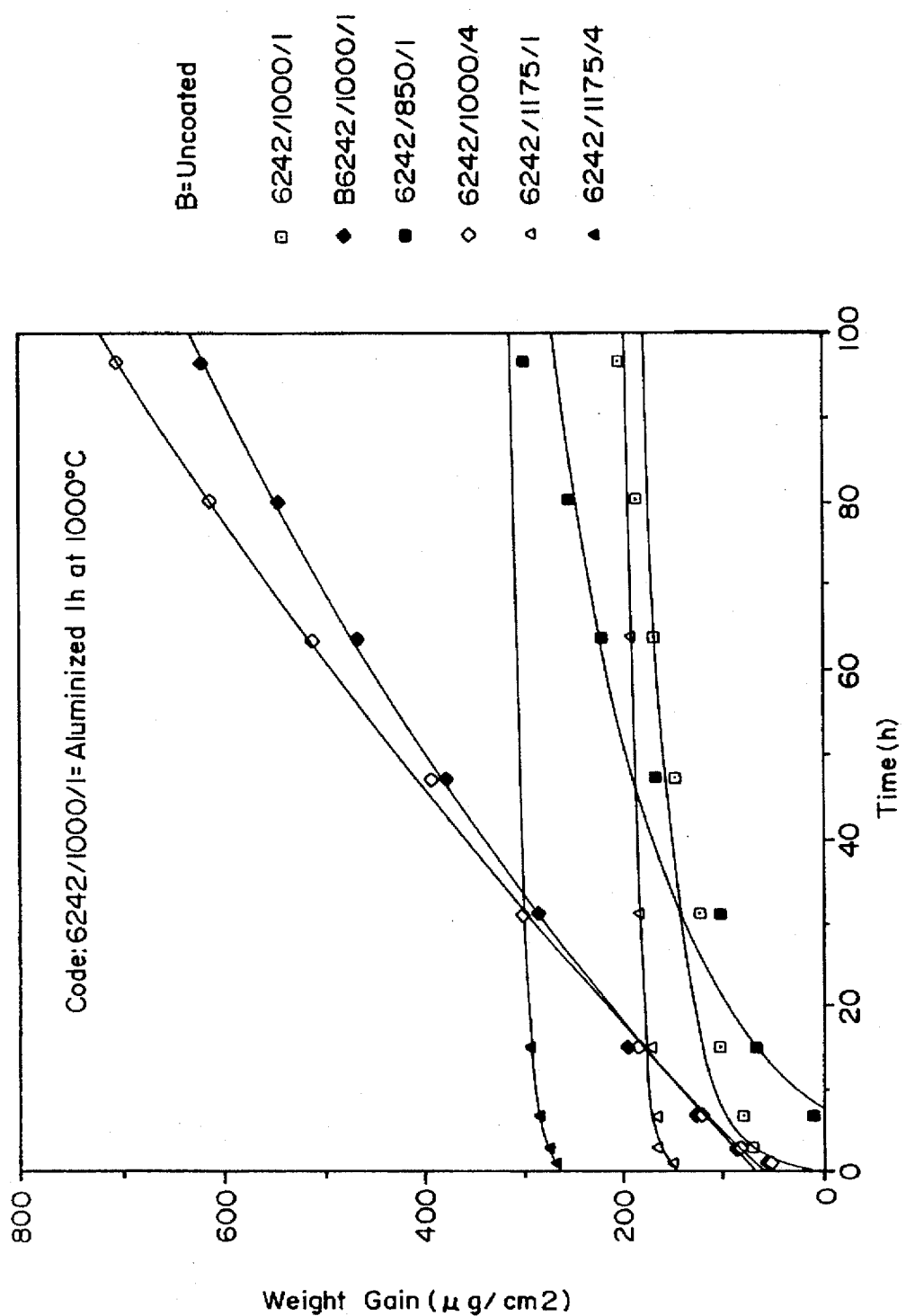
FIG. 9 Effect of Aluminization Treatment on Oxidation of Ti-6Al-2Sn-4Zr-2Mo at 650°C

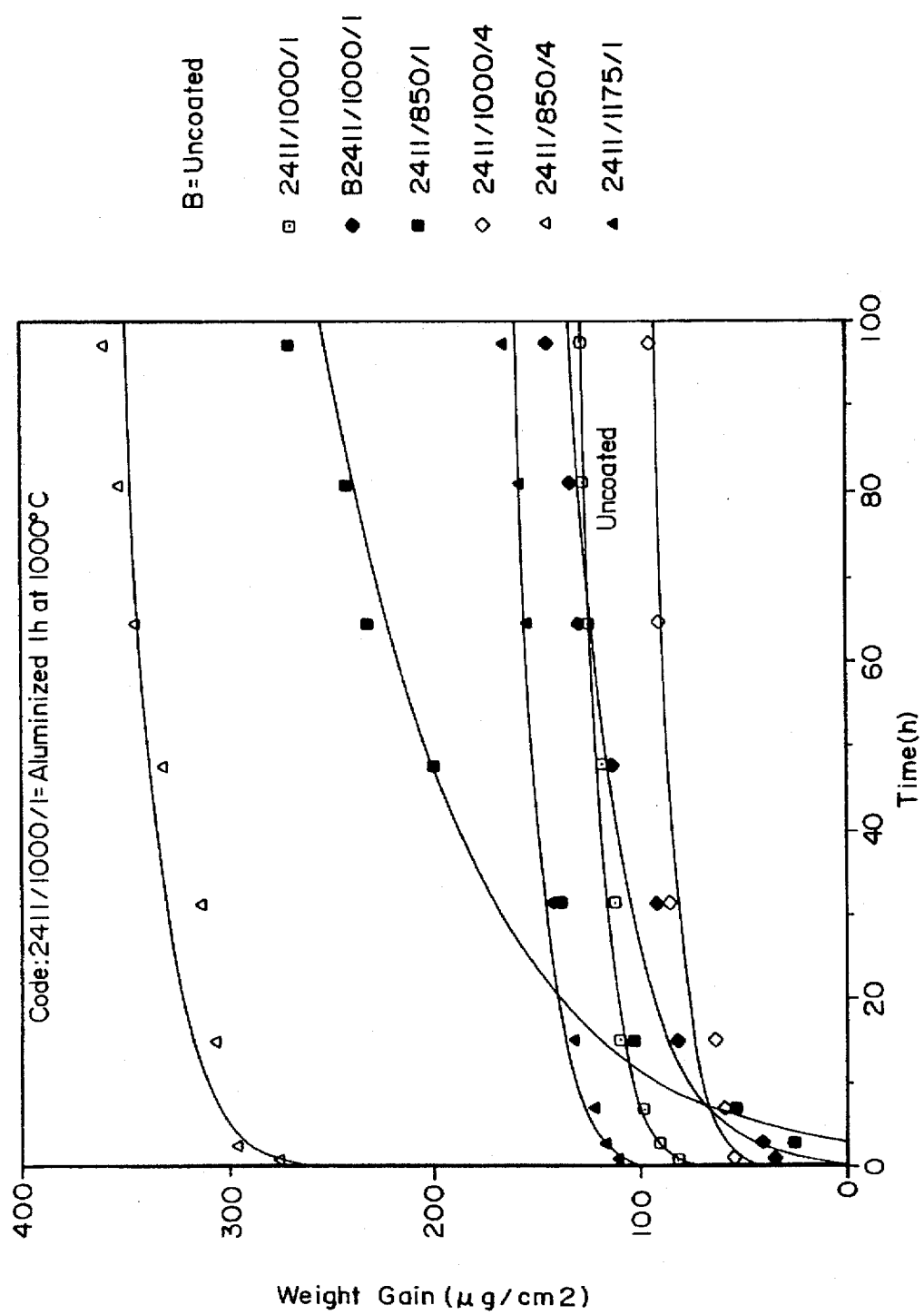
FIG. 10 Effect of Aluminization Treatment on Oxidation of Ti-24Al-11Nb at 650°C

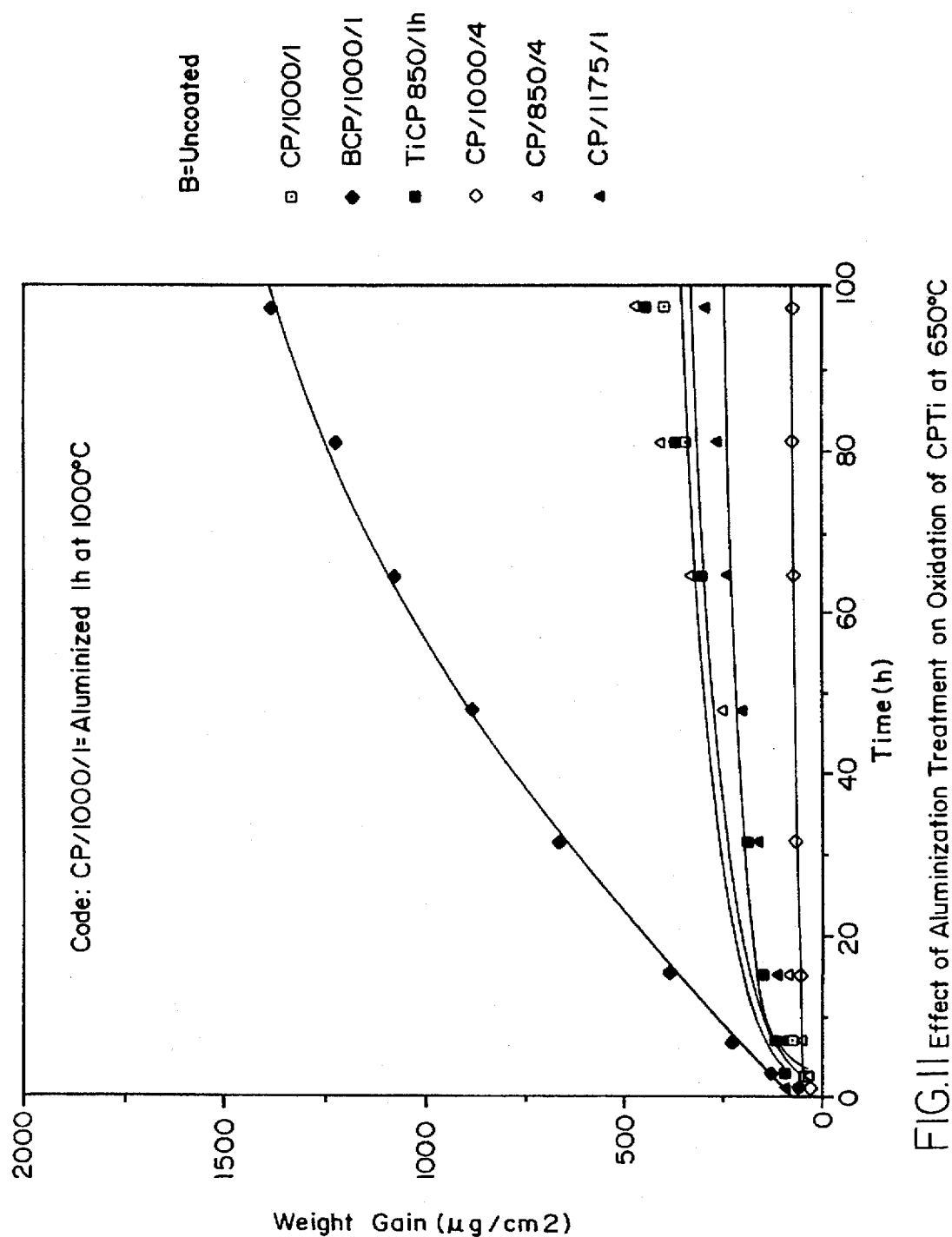
FIG. 11 Effect of Aluminization Treatment on Oxidation of CPTi at 650°C

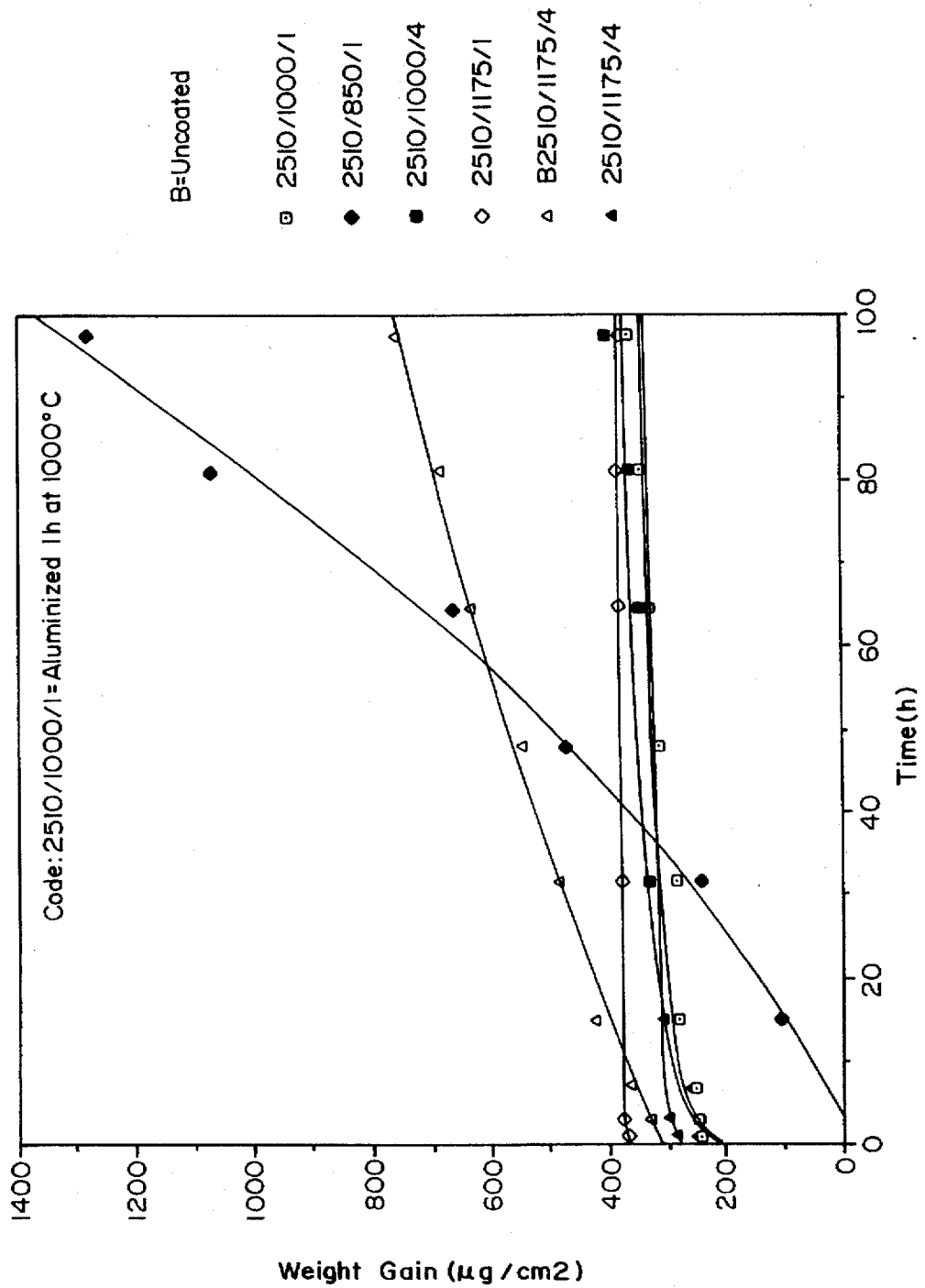
FIG. 12 Effect of Aluminizing on Oxidation of Ti-25Al-10Nb-3V-1Mo at 650°C

OXIDATION PROTECTION METHOD FOR TITANIUM

DESCRIPTION

1. Technical Field

The present invention relates to a method for the protection of titanium employed in structural applications such as hypersonic aircraft or aircraft engines.

Hypersonic vehicles represent the next generation of advanced aircraft that are currently being considered for development by the government for both civilian and military applications. A major constraint to the construction of such a vehicle is related to the choice of available structural materials for airframe and engine applications that will fulfill the stringent requirements of hypersonic flight. Such materials must be low density, strong at elevated temperatures, and resist environmental degradation due to both hydrogen, oxygen and nitrogen. The only class of materials which comes close to fitting these requirements is titanium alloys. Recent work on titanium alloys has indicated that titanium-aluminum alloys in the form of titanium aluminides offer promise toward meeting the program goals; however, a number of problems remain to be solved before titanium aluminides can be effectively utilized. These relate in part to their lack of environmental resistance in a hydrogen atmosphere associated with the liquid hydrogen fuel and oxidizing atmosphere during hypersonic flight in the upper earth's atmosphere. It is expected that skin temperatures will reach up to 1000° C. (1800° F.) over major portions of the vehicle. Titanium aluminides have good air oxidation resistance up to about 650° C. (1200° F.) but above that temperature oxidation leads to significant degradation of the mechanical properties of titanium aluminides. This is due to the high solubility and absorption of oxygen into the bulk, leading to oxygen embrittlement of the metal. Alloying of the metal to produce a stable oxide layer via selective oxidation of alloying constituents may not be a viable approach unless the alloying produces a very low terminal solid solubility so that oxygen diffusion in the bulk is very low. In addition, bulk alloying may produce undesirable mechanical properties such as low ductility or poor creep or fracture properties.

2. Prior Art

An alternative approach to preserve the desirable mechanical properties of the bulk material is to alloy the surface with alloying elements that produce a stable coherent oxide scale and provide an oxygen diffusion barrier at the surface. Aluminizing of iron, nickel and cobalt-base alloys has been used in the prior art to provide an oxidation resistant surface. Techniques such as pack cementation and dipping in molten metal have been used to reduce oxidation rates via formation of an aluminide. Recent work by Subrahmanyam and J. Annapurna, *High Temperature Cyclic Oxidation of Aluminide Layers on Titanium*, Oxidation of Metals,. Vol. 26 Nos. 3/4 (1986) has shown that pack cementation can be used to form an aluminized surface on titanium alloys that offers superior oxidation resistance. This was attributed to the formation of a surface layer of $TiAl_3$ on the surface. This layer will selectively oxidize the aluminum to form a stable $Al_2O_3$ scale that offers low permeability to oxygen. Although pack cementation may be one approach to aluminizing titanium alloy surfaces it may not be scalable to large parts and difficulties are encountered in producing uniform controllable layers of aluminide due to the problems of obtaining uniformity in the pack process.

SUMMARY OF THE INVENTION

It is therefore an object of the present invention to overcome these and other difficulties encountered in the prior art.

It is also an object of the invention to provide a structural material that is low in density, strong at elevated temperatures and resistant to environmental degradation and especially degradation due to oxygen, nitrogen and hydrogen.

It is also an object of the invention to provide structural materials for airframe and engine application for use in aircraft and especially hypersonic aircraft.

It is a further object of the invention to provide a titanium material that will achieve the foregoing objects and especially a titanium material that contains a combination of titanium and aluminum, especially an alloy of titanium and aluminum or an aluminide on its surface.

These and other objects have been achieved by the present invention which is more fully set forth in the following description and appended drawings.

The present invention seeks to overcome these disadvantages by suspending the titanium alloy substrate in a pure vapor of aluminum so that all surfaces see an equal concentration of aluminum from the vapor phase during the aluminizing process. This is accomplished according to one embodiment by heating the substrate to be aluminized in the presence of pure aluminum above its melting point in a closed container. The molten aluminum establishes its vapor pressure at that temperature, provided that the oxygen concentration in the vapor phase is low enough so that oxidation of the molten aluminum to form a protective alumina scale does not occur. The process temperature must be chosen such that the vapor pressure of aluminium is high enough to provide aluminum enrichment at the surface and the reaction rate of the aluminum vapor with the titanium alloy surface is sufficient to form the $TiAl_3$ phase. Since these two processes are fundamentally different in nature, the determination of the process temperature for optimum oxidation protection of each titanium alloy substrate must be performed empirically.

BRIEF DESCRIPTION OF THE DRAWINGS

FIGS. 1-8 are typical of the oxidation of various titanium alloys and titanium aluminides vs temperature and time.

FIGS. 9-12 illustrate the effect of the aluminizing treatment on the oxidation performance of various titanium alloys and aluminides at 650° C. (1200° F.).

DESCRIPTION OF THE PREFERRED EMBODIMENTS OF THE INVENTION

The present invention relates to a titanium article of manufacture having an oxidation resistant surface. This surface is a layer of an alloy of titanium and aluminum formed by the vapor deposition of aluminum on the surface of titanium, the surface thus alloyed being subsequently oxidized. The titanium on which the aluminum is deposited may be an alloy of titanium with a element from Group IB, IIIA, IVA, IVB, VA, VB, VIB, VIIB or VIII of the Periodic Table of Elements or mixtures thereof. Examples of these elements include copper, aluminum, tin, silicon, carbon, zirconium, nitrogen, vanadium, niobium, tantalum, chromium, molybdenum, manganese, iron, palladium, cobalt and nickel or mixtures thereof. All of the foregoing specific elements have been used industrially for the formation of titanium alloys. For the purpose of the present invention, the preferred elements for forming the titanium alloys are aluminum, tin, zirconium, vanadium, niobium, chromium and molybdenum and mixtures thereof.

The various titanium alloys, when employed, can comprise either the alpha, alpha-beta or beta phase alloys known in the art. Titanium and titanium alloys that may be used in this respect are more fully described in Kirk-Othmer, *Encyclopedia of Chemical Technology*, 3rd Edition, Volume 23, pp. 98–130 which is incorporated herein by reference.

The aluminum deposited on the surface of titanium forms a layer such as an aluminide layer whose thickness varies from about 2 to about 8 µm which is from about 1,000 to about 1,500 µg/cm$^2$ based on the weight of aluminum deposited. Although pure aluminum may be deposited, it is also within the scope of the present invention to use alloys of aluminum for the vapor deposition e.g. Al—Cu alloys and the like.

The surface thus prepared comprises a combination of aluminum and titanium such as an alloy of aluminum and titanium or an aluminide and will be referred to as the aluminized surface.

The vapor deposition may be effected by methods well known in the art such as by melting the appropriate aluminum material in a crucible and suspending the titanium on which aluminum vapor deposition is to be obtained, over the molten aluminum for a time sufficient to obtain an aluminized layer on the titanium.

Other methods of coating titanium with aluminum can be employed such as by physical vapor deposition employing vacuum apparatus, electrochemical deposition, cathode sputtering, chemical vapor deposition (cvd) and the like.

The titanium sample is maintained in the aluminum vapor thus obtained for a time sufficient to develop the appropriate coating thickness of aluminum on titanium after which, the surface on which the aluminum is deposited is exposed to an oxidizing environment. These temperatures will vary from about 650° C. to about 1175° C. whereas the time for conducting such aluminizing will be from about one hour to about four hours. Typically, the aforesaid oxidizing environment will be obtained in a muffle furnace in which air oxidation of the surface may be effected to develop an oxide on the surface thus treated in an amount from about 100 to about 1,000 µg/cm$^2$ based on the weight of oxygen added at the surface. The oxides formed on the surface are believed to be oxides of aluminum such as $Al_2O_3$ although other oxides may be formed such as oxides of titanium including mixtures thereof with oxides of aluminum as well as oxides of the various other alloying elements that may be present. Although the inventor does not wish to be limited by any theory, it is believed that the oxide formed is substantially an oxide of aluminum, $Al_2O_3$ including the various forms of such aluminum oxides such as alpha aluminum oxide. Where traces of water are present the so-called transition aluminas are formed e.g. gamma, rho, delta, eta, theta, chi, kappa and iota aluminum oxides are produced.

Although air oxidation at elevated temperatures is a preferred embodiment, the surface of the titanium having aluminum deposited thereon may be oxidized by other methods known in the-art such as using other chemical oxidizing agents such as hydrogen peroxide, various other oxidizing agents such as CO $CO_2$, $NO_2$, NO, Ozone ($O_3$) and electrochemical oxidation all of which are known in the art.

The following examples are illustrative;

A titanium alloy sheet of thickness 0.030" thick was cut into 0.5"×0.5" squares. Table 1 lists the titanium alloys that were investigated. A small hole drilled in the upper portion of each specimen was used to suspend it in a 1.5" diameter silicon nitride crucible containing a small charge of pure aluminum. An alumina cover was placed on the crucible which was placed in a vacuum furnace. Specimens were heated to temperatures from 850°–1175° C.(1560° F.–2150° F.) for times from 1–4 h. All specimens exhibited a weight gain due to the aluminizing treatment which resulted in the combination of aluminum with titanium on the surface of the titanium to produce an aluminized surface. X-ray diffraction studies revealed the formation of $TiAl_3$ on the surface of the specimen. The coating thickness of the aluminum combined with the titanium as about 2 to about 5 µm. Aluminized specimens were suspended either in an air tube furnace or a muffle furnace pre-heated to temperatures between 650°–900° C. (1200°–1650° F.) and for times up to 100 h. Specimens were cyclically oxidized by removing them from the furnace after pre-determined times and weighing them using a microbalance. In all cases, for comparison purposes an as-received specimen was placed alongside the aluminized specimen. Oxygen weight gains of the cyclically oxidized specimens were reduced to µg/cm$^2$ vs time and the results plotted in FIGS. 1–12.

In FIGS. 9–12, various designations are employed after the titanium material is identified which give the aluminizing temperatures in deqrees centigrade and the time the sample was exposed to these temperatures before they were oxidized. The designation "1000/4 h" is used to signify that the specimen was aluminized as described in these examples at 1,000° C. for four hours; "850/1 h" signifies the specimen was aluminized at 850° C. for one hour and the like.

Good results were obtained with Ti-6-2-4-2 as shown in FIG. 9 when aluminized at greater than about 850° C. to about 1175° C. for a time greater than about one hour to about four hours. Especially good results were obtained at about 1,000° C. to about 1,175° C. and about one hour.

Ti-24-11, as shown in FIG. 10, when aluminized at about 850° C. to about 1175° C. for times from about one hour to about four hours also gave good results, especially at about 1000° C. for about four hours. Similar results were obtained with CPTi as shown in FIG. 11.

Substantially the same results were obtained with Ti-25-10-3-1 as with Ti-6-2-4-2 except that especially good results were obtained over the full range of time and temperature conditions i.e. temperatures greater than about 850° C. up to about 1175° C. for times greater than one hour up to about four hours as shown in FIG. 12.

TABLE 1

List of Titanium Alloys

| FIG | Alloy | Composition (Wt. %) | | | | | | |
|---|---|---|---|---|---|---|---|---|
| | | Al | V | Cr | Sn | Mo | Zr | Nb |
| 1, 11 | (1)CPTi | | | | | | | |
| | Ti-6-4 | 6 | 4 | | | | | |
| 5 | Ti-15-3 | | 15 | 3 | 3 | 3 | | |
| 9 | Ti-6-2-4-2 | 6 | | | 2 | 2 | 4 | |
| 2, 3, 4, 10 | Ti-24-11 | 14 | | | | | | 21 |
| 6, 7, 8, 12 | Ti-25-10-2-1 | 14 | 3.2 | | | 2 | | 20 |

(1)commercial purity Ti having less than about 0.5% impurities.

It can be seen from FIGS. 1–12, that each alloy system has an aluminizing treatment that is optimum from the standpoint of oxidation performance. Thus the time-temperature processing for each titanium alloy must be empirically determined.

Generally speaking, though, the air oxidation process can be conducted at temperatures from about 650° C. to about 1,000° C. and especially from about 650° C. to about 800° C. for times from 10 to about 100 hours.

Thus by employing the aforementioned process, an article of manufacture is obtained comprising a titanium or titanium alloy having improved oxidation resistance which may be used in both industrial and military applications for devices in which high temperature oxidizing environments are present. This includes both civilian and military engines and airframes, especially advanced aerospaced vehicles as well as the chemical process industries wherein high temperature corrosion resistant vessels and tubing is employed.

Although the invention has been described by reference to some embodiments, it is not intended that the novel article and process is to be limited thereby, but that modifications thereof are intended to be included as falling within the spirit and broad scope of the foregoing disclosure and following claims.

What is claimed is:

1. A titanium article of manufacture having an oxidation resistant surface consisting essentially of a $TiAl_3$ layer on an outer surface of said article, said layer formed by vapor deposition of an aluminum material on the surface of said titanium, said surface having been oxidized after said vapor deposition.

2. The article of claim 1 where said titanium on which said aluminum is deposited is an alloy of titanium.

3. The article of claim 2 where said alloy of titanium contains an alloying element which is a Group IB, IIIA, IVA, IVB, VA, VB, VIB, VIIB or VIII element from the periodic Table of Elements or mixtures thereof.

4. The article of manufacture of claim 3 where said alloy of titanium contains an alloying element which is aluminum, vanadium, chromium, tin, molybdenum, zirconium niobium or mixtures thereof.

5. The article of manufacture of claim 3 where said alloy of titanium on which said aluminum is deposited is an alpha-phase, alpha-beta phase or beta-phase alloy.

6. The article of manufacture of claim 1 where said aluminum is an alloy of aluminum.

7. The article of manufacture of claim 4 where said aluminum on the surface of said titanium is about 2 to about 5 µm thick.

8. The article of manufacture of claim 7 where said oxide is present on the surface of said article in an amount from about 100 to about 1,000 µg/cm$^2$ based on oxygen.

9. The article of claim 1 where said layer is an alloy of aluminum and titanium.

10. The article of claim 1 where said titanium is Ti-6-2-4-2 aluminized at greater than about 850° C. to about 1175° C. for a time greater than about one hour to about four hours.

11. The article of claim 10 where said titanium is aluminized at about 1,000° C. to about 1,175° C. for about one hour.

12. The article of claim 1 where said titanium is Ti-24-11 aluminized at about 850° C. to about 1175° C. for a time of about one hour to about four hours.

13. The article of claim 12 where said titanium is aluminized at about 1,000° C. for about four hours.

14. The article of claim 1 where said titanium is CpTi aluminized at about 850° C. to about 1175° C. for a time of about one hour to about four hours.

15. The article of claim 14 where said titanium is aluminized at about 1,000° C. for about four hours.

16. The article of claim 1 where said titanium is Ti-25-10-3-1 aluminized at greater than about 850° C. to about 1175° C. for a time greater than about one hour to about four hours.

* * * * *